US012628401B2

(12) United States Patent
Chang et al.

(10) Patent No.: US 12,628,401 B2
(45) Date of Patent: May 12, 2026

(54) GATE PROFILE MODULATION FOR SEMICONDUCTOR DEVICE

(71) Applicant: TAIWAN SEMICONDUCTOR MANUFACTURING COMPANY, LTD., Hsinchu (TW)

(72) Inventors: Tien-Shun Chang, Hsinchu (TW); Kuo-Ju Chen, Hsinchu (TW); Sih-Jie Liu, Hsinchu (TW); Wei-Fu Wang, Hsinchu (TW); Yi-Chao Wang, Hsinchu (TW); Li-Ting Wang, Hsinchu (TW); Su-Hao Liu, Hsinchu (TW); Huicheng Chang, Hsinchu (TW); Yee-Chia Yeo, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 485 days.

(21) Appl. No.: 17/824,690

(22) Filed: May 25, 2022

(65) Prior Publication Data

US 2023/0387251 A1 Nov. 30, 2023

(51) Int. Cl.
| | |
|---|---|
| *H10D 64/01* | (2025.01) |
| *H01L 21/265* | (2006.01) |
| *H10D 30/01* | (2025.01) |
| *H10D 30/62* | (2025.01) |
| *H10P 30/20* | (2026.01) |

(52) U.S. Cl.
CPC ......... *H10D 64/017* (2025.01); *H10D 30/024* (2025.01); *H10D 30/6211* (2025.01); *H10P 30/20* (2026.01)

(58) Field of Classification Search
CPC . H01L 21/265; H01L 29/66545–66795; H01L 21/28114; H10D 64/017
See application file for complete search history.

(56) References Cited

U.S. PATENT DOCUMENTS

| | | | | |
|---|---|---|---|---|
| 2004/0132236 A1* | 7/2004 | Doris | ................ | H01L 21/28114 257/E21.345 |
| 2014/0015104 A1* | 1/2014 | Su | ......................... | H10D 30/601 438/549 |
| 2017/0110577 A1* | 4/2017 | Wang | ................ | H01L 29/66795 |
| 2017/0207117 A1* | 7/2017 | Wang | ................ | H10D 84/0149 |
| 2019/0164776 A1* | 5/2019 | Choi | ...................... | H10D 30/62 |
| 2021/0098592 A1* | 4/2021 | Kang | ...................... | H10F 99/00 |

OTHER PUBLICATIONS

Gossmann, Precision Ion Implantation: A Critical Tool for Advanced Device Processing, 2008 (Year: 2008).*
(Continued)

*Primary Examiner* — Britt Hanley
*Assistant Examiner* — Casey Paul Boatman
(74) *Attorney, Agent, or Firm* — Birch, Stewart, Kolasch & Birch, LLP

(57) ABSTRACT

A method for manufacturing a semiconductor device includes: forming a patterned structure on a substrate, the patterned structure including a dielectric layer and a dummy gate structure disposed in the dielectric layer; and subjecting the patterned structure to an ion implantation process so as to modulate a profile of the dummy gate structure.

20 Claims, 14 Drawing Sheets

(56)         References Cited

OTHER PUBLICATIONS

Charavel, Tuning of Etching Rate by Implantation: Silicon, Polysilicon and Oxide, 2006 (Year: 2006).*

Fitzgerald, Analysis of Polysilicon Critical Dimension Variation for Submicron CMOS Processes, 1994 (Year: 1994).*

Yang, Grain Size Modulation on Impurity Doped Polysilicon by Implant and Rapid Thermal Process Tuning and Its Influence on Sheet Resistance, 2014 (Year: 2014).*

Giri, Studies on the surface swelling of ion-irradiated silicon: Role of defects, 2005 (Year: 2005).*

Hu, Ion-implantation-induced patterns formation on silicon substrates, 2009 (Year: 2009).*

* cited by examiner

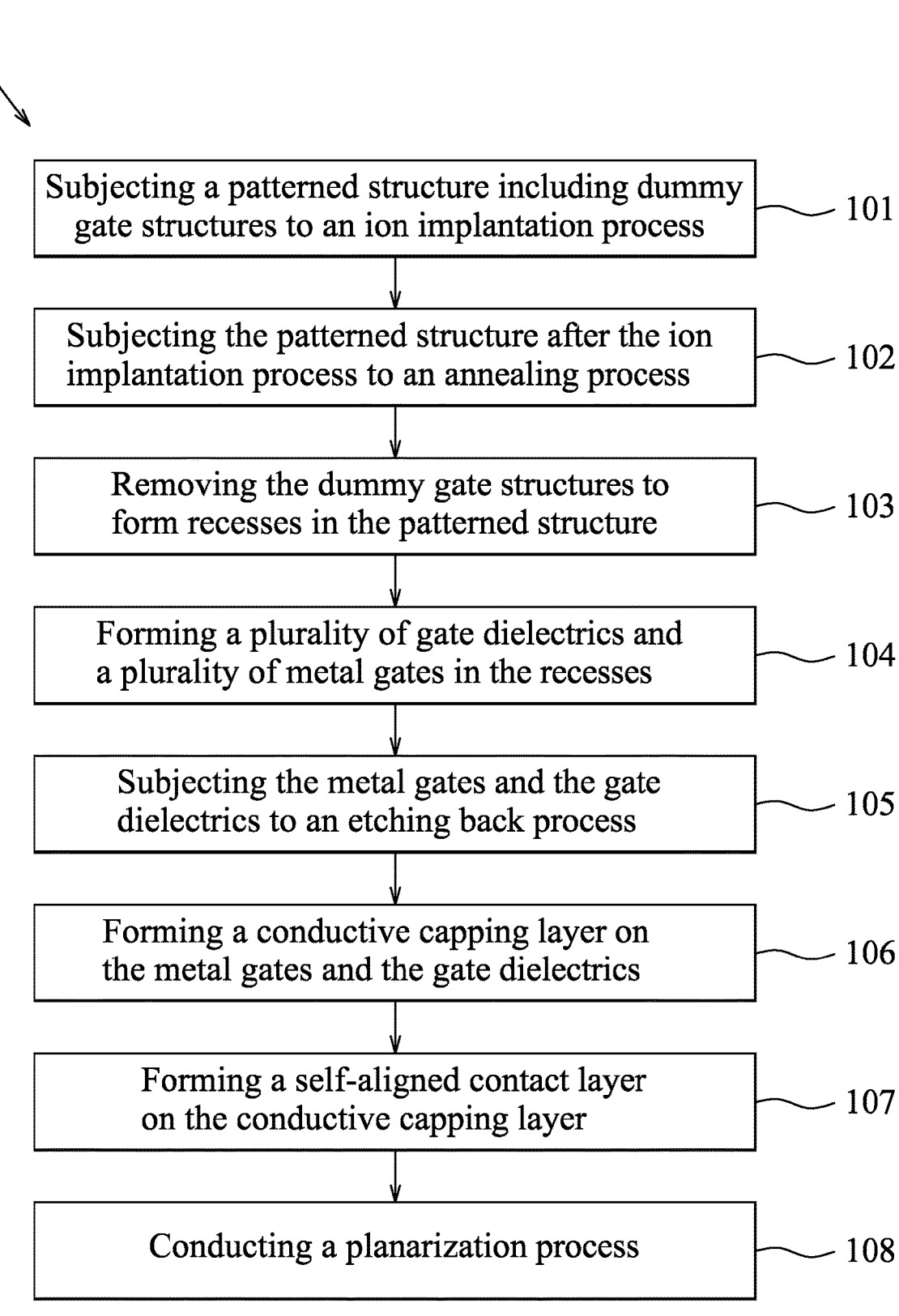

100

Subjecting a patterned structure including dummy gate structures to an ion implantation process — 101

Subjecting the patterned structure after the ion implantation process to an annealing process — 102

Removing the dummy gate structures to form recesses in the patterned structure — 103

Forming a plurality of gate dielectrics and a plurality of metal gates in the recesses — 104

Subjecting the metal gates and the gate dielectrics to an etching back process — 105

Forming a conductive capping layer on the metal gates and the gate dielectrics — 106

Forming a self-aligned contact layer on the conductive capping layer — 107

Conducting a planarization process — 108

FIG.4

GATE PROFILE MODULATION FOR SEMICONDUCTOR DEVICE

BACKGROUND

In a method for manufacturing a semiconductor device, stress imbalance might be produced among poly gates (polysilicon gate electrodes), spacers, and an interlayer dielectric layer (for example, a silicon oxide layer), such that recesses formed by removing the poly gates have a bowing profile. Metal gates thus formed in the recesses might have voids or seams as a metal material fills into the recesses to form the metal gates, and might be detached during an etching back process. Therefore, the semiconductor device thus manufactured might have severe defects, and the yield of such semiconductor device might decrease significantly.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4 is a flow diagram illustrating a method for manufacturing a semiconductor device in accordance with some embodiments.

DETAILED DESCRIPTION

Figure 1:
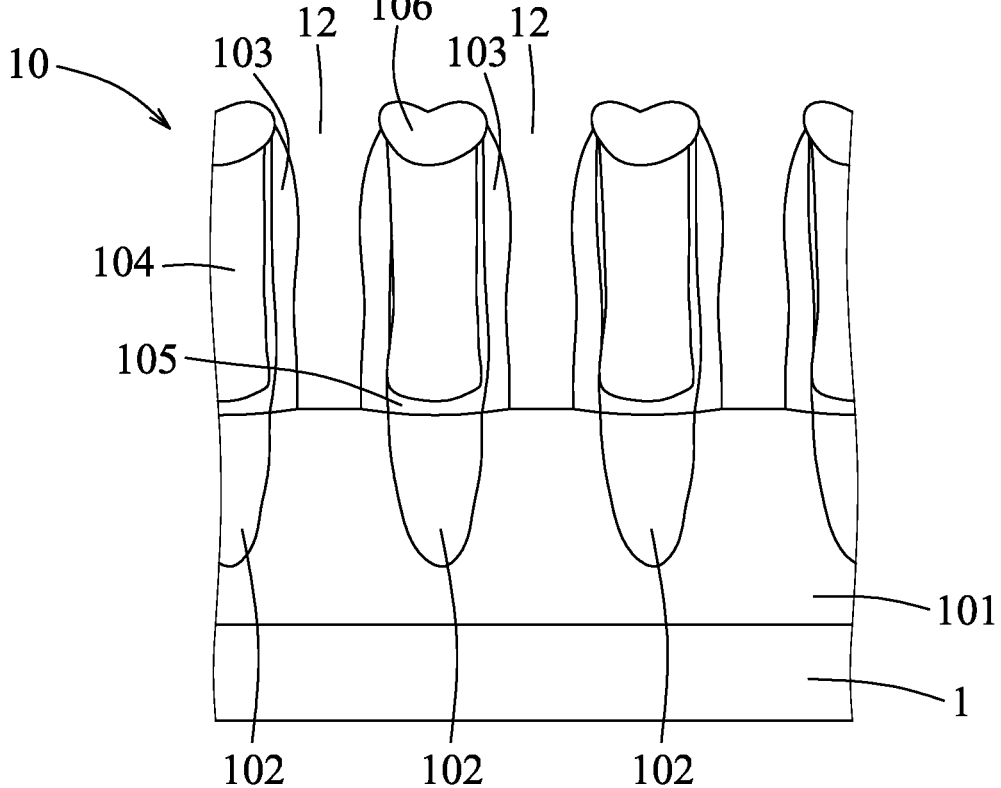
FIGS. 1 to 3 are schematic views illustrating some intermediate stages for producing metal gates in a method for manufacturing a semiconductor device.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "over," "below," "upper," "lower," "upwardly," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
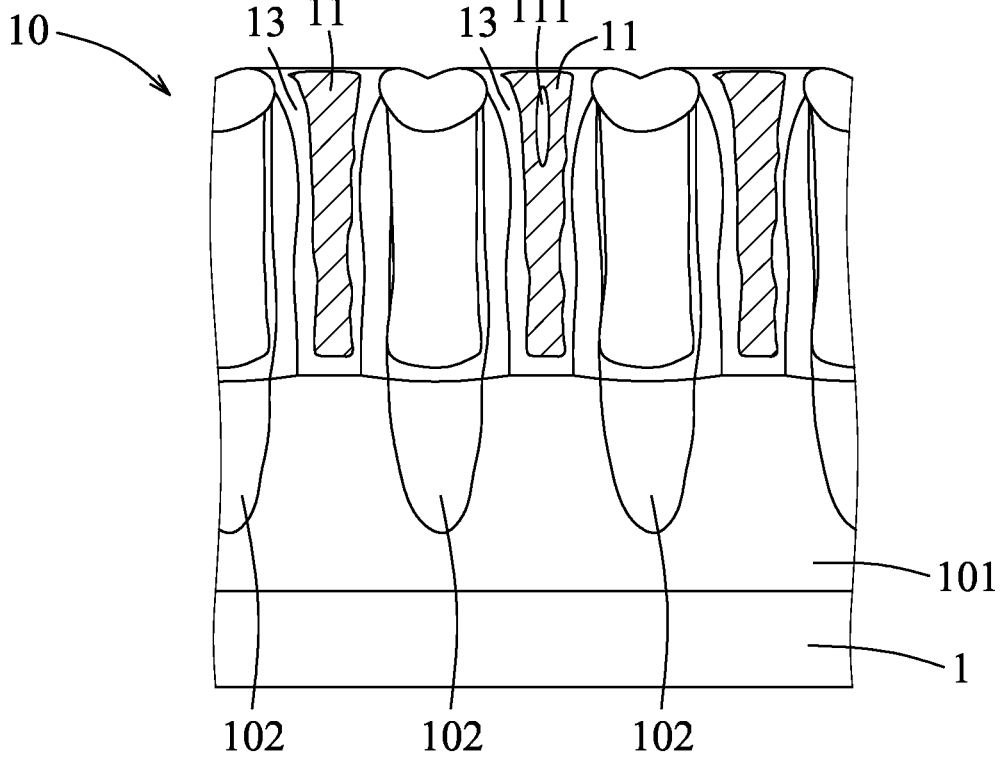
Figure 3:
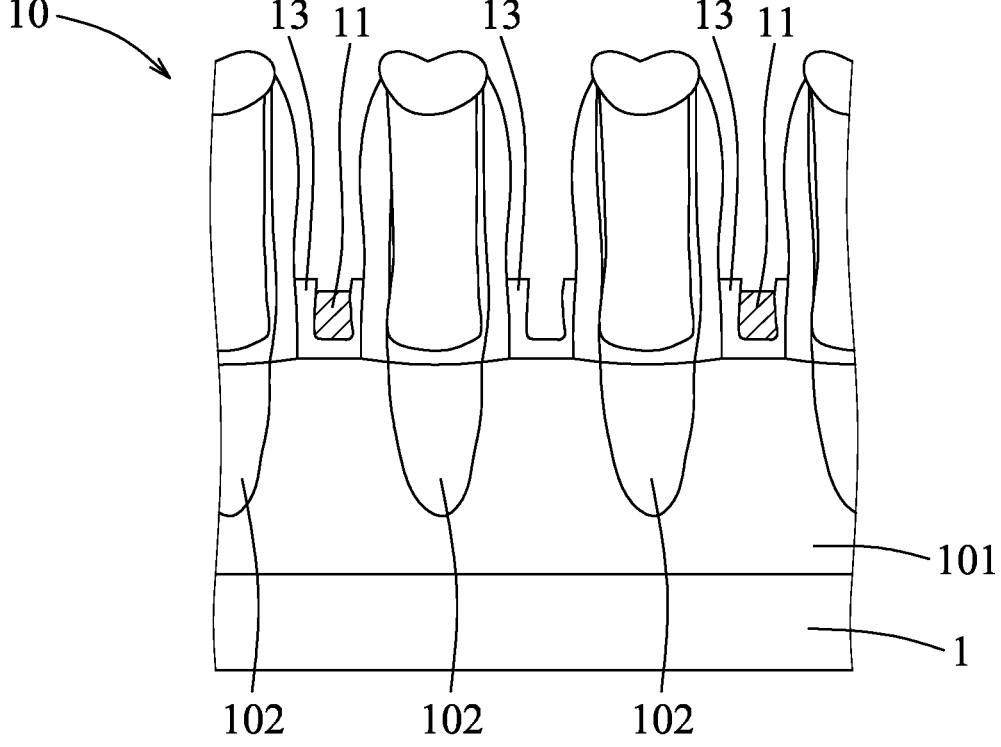

Referring to the examples illustrated in FIGS. 1 to 3, in a method for manufacturing a semiconductor device, a process for forming metal gates 11 includes: forming a plurality of recesses 12 in a patterned structure 10 disposed on a substrate 1; forming a plurality of metal gates 11 respectively disposed in the recesses 12 and a plurality of gate dielectrics 13 respectively disposed in the recesses 12 to separate the metal gates 11 from the patterned structure 10; and etching back the metal gates 11 and the gate dielectrics 13. The patterned structure 10 includes at least one semiconductor fin 101 disposed on the substrate 1 (for example, a semiconductor substrate), a plurality of source/drain regions 102 disposed in the semiconductor fin 101 and spaced apart from each other to alternate with the recesses 12, a plurality of spacers 103 disposed on and extending upwardly from the semiconductor fin 101 such that each of the recesses 12 is defined by corresponding two of the spacers 103, an interlayer dielectric (ILD) layer (for example, but not limited to, a silicon oxide layer) 104 disposed on the semiconductor fin 101, and a contact etch stop layer (CESL) 105 disposed to separate the ILD layer 104 from the spacers 103. The recesses 12 are formed by removing a plurality of poly gates (polysilicon gate electrodes, not shown) formed among the spacers 103. A patterned mask 106 is formed on the patterned structure 10. Stress imbalance may be produced among the poly gates, the spacers 103, and the ILD layer 104, such that the recesses 12 might have a bowing profile. The metal gates 11 thus formed in the recesses 12 might have voids (or seams) 111 as a metal material fills into the recesses 12 to form the metal gates 11. In addition, the metal gates 11 might be detached during an etching back process, as illustrated in FIG. 3. A semiconductor device thus manufactured might have severe defects, and the yield of the semiconductor device might decrease significantly.

The present disclosure is directed to a method for manufacturing a semiconductor device in which gate profile modulation is conducted by an ion implantation process, an annealing process, or a combination thereof, and a semiconductor device manufactured thereby. FIG. 4 illustrates a method 100 for manufacturing a semiconductor device in accordance with some embodiments. FIGS. 5 to 10 are schematic views of a semiconductor device 20 at some intermediate stages of the manufacturing method as depicted in FIG. 4 in accordance with some embodiments. Additional steps can be provided before, after or during the method 100, and some of the steps described herein may be replaced by other steps or be eliminated. Similarly, further additional features may be present in the semiconductor device 20, and/or features present may be replaced or eliminated in additional embodiments.

Figure 5:
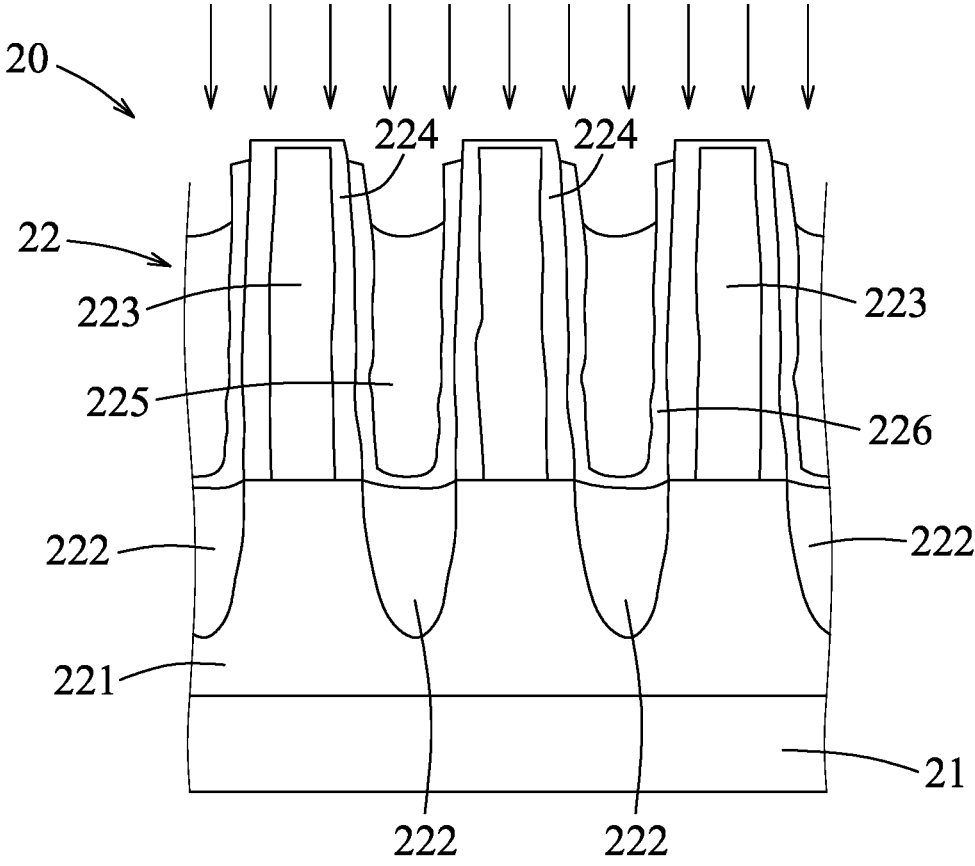
FIGS. 5 to 10 are schematic views illustrating some intermediate stages of the manufacturing method as depicted in FIG. 4 in accordance with some embodiments.

Referring to FIG. 4 and the example illustrated in FIG. 5, the method 100 begins at step 101, where a patterned structure including dummy gate structures is subjected to an ion implantation process. A patterned structure 22 to be subjected to the ion implantation process (as shown by arrows in FIG. 5) is disposed on a substrate 21. In some embodiments, the substrate 21 is a semiconductor substrate which may include, for example, but not limited to, an elemental semiconductor or a compound semiconductor. An elemental semiconductor includes a single species of atoms, such as silicon (Si) or germanium (Ge) in column XIV of the periodic table, and may be in crystal, polycrystalline, or an amorphous form. Other suitable materials are within the contemplated scope of the present disclosure. A compound semiconductor includes two or more elements, and examples thereof may include, but not limited to, silicon carbide (SiC), gallium arsenide (GaAs), gallium phosphide (GaP), indium phosphide (InP), indium arsenide (InAs), indium antimonide (InSb), silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and gallium indium arsenide phosphide (GaInAsP). Other suitable materials are within the contemplated scope of the present disclosure. The compound semiconductor may have a gradient feature in which the compositional ratio thereof changes from one location to another location therein. The compound semiconductor may be formed over a silicon substrate. The compound semiconductor may be strained. In some embodiments, the semiconductor substrate may include a multilayer compound semiconductor structure. In some embodiments, the semiconductor substrate may be a semiconductor on insulator (SOI) (e.g., silicon germanium on insulator (SGOI)). Generally, an SOI substrate includes a layer of a semiconductor material such as epitaxial silicon, germanium, silicon germanium, or combinations thereof. Other suitable materials are within the contemplated scope of the present disclosure. The SOI substrate may be doped with a P-type dopant, for example, but not limited to, boron (Br), aluminum (Al), or gallium (Ga). Other suitable materials are within the contemplated scope of the present disclosure. Alternatively, the SOI substrate may be doped with an N-type dopant, for example, but not limited to, nitrogen (N), phosphorus (P), or arsenic (As). Other suitable materials are within the contemplated scope of the present disclosure.

The patterned structure 22 includes at least one semiconductor fin 221 disposed on the substrate 21; a plurality of source/drain regions 222 disposed in the semiconductor fin 221 and spaced apart from each other; a plurality of dummy gate structures 223 disposed on the semiconductor fin 221 to alternate with the source/drain regions 222; a plurality of spacer layers 224, each of which covers two opposite lateral walls and a top surface of a corresponding one of the dummy gate structures 223; an interlayer dielectric (ILD) layer 225 disposed on the semiconductor fin 221, and a contact etch stop layer (CESL) 226 disposed to separate the ILD layer 225 from the spacer layers 224.

In some embodiments, the semiconductor fin 221 may be formed by the following steps. A plurality of isolation regions are formed in the substrate 21 to define a plurality of substrate strips among the isolation regions. Top or entire portions of the substrate strips are removed to form recesses among the isolation regions. Semiconductor strips are selectively and epitaxially grown in the recesses using a semiconductor material (for example, but not limited to, silicon (Si), silicon germanium (SiGe), silicon boride (SiB), or other suitable semiconductor materials, or combinations thereof). The isolation regions are recessed by, for example, but not limited to, an etching process to form a plurality of shallow trench isolation (STI) regions, such that parts of the semiconductor strips over top surfaces of the STI regions are configured as the semiconductor fin 221. In some embodiments, the semiconductor fin 221 may have the same semiconductor material as that for the substrate 21.

In some embodiments, the source/drain regions 222 may be formed in the semiconductor fin 221 by epitaxially growing a semiconductor material through a selective epitaxial growth (SEG) process. The source/drain regions 222 may be, for example, but not limited to, crystalline silicon or other suitable semiconductor materials in-situ doped with a P-type dopant during the SEG process, so as to form P-type field effect transistor (p-FET) source/drain regions. The P-type dopant may be, for example, but not limited to, boron, aluminum, gallium, indium, $BF_2$, or combinations thereof. Other suitable materials are within the contemplated scope of the present disclosure. Alternatively, the source/drain regions 222 may be, for example, but not limited to, crystalline silicon or other suitable semiconductor materials in-situ doped with an N-type dopant during the SEG process, so as to form N-type field effect transistor (n-FET) source/drain regions. The N-type dopant may be, for example, but not limited to, phosphorous, arsenic, antimony, or combinations thereof. Other suitable materials are within the contemplated scope of the present disclosure.

In some embodiments, each of the dummy gate structures 223 includes a dummy gate electrode and a dummy gate dielectric disposed to separate the dummy gate electrode from the semiconductor fin 221. The dummy gate electrode is made of a gate electrode material, which may include, for example, but not limited to, polycrystalline silicon (polysilicon), single crystalline silicon, amorphous silicon, or combinations thereof. Other suitable materials are within the contemplated scope of the present disclosure. The dummy gate dielectric is made of a gate dielectric material, which may include, for example, but not limited to, silicon oxide, silicon nitride, silicon oxynitride, high dielectric constant (k) materials, or combinations thereof. Other suitable materials are within the contemplated scope of the present disclosure.

In some embodiments, the spacer layers 224 may include, for example, but not limited to, silicon oxide, silicon nitride, silicon carbide, silicon oxycarbide, silicon oxynitride, silicon carbonitride, silicon oxycarbonitride, or combinations thereof. Other suitable materials are within the contemplated scope of the present disclosure.

In some embodiments, the CESL 226 may include, for example, but not limited to, silicon nitride, carbon-doped silicon nitride, or a combination thereof. In some embodiments, the ILD layer 225 may include, for example, but not limited to, silicon oxide, silicon nitride, silicon carbide, silicon oxycarbide, silicon oxynitride, hydrogenated silicon oxycarbide, spin-on glass (SOG), amorphous fluorinated carbon, fluorinated silica glass (FSG), Xerogel, Aerogel, polyimide, Parylene, BCB (bis-benzocyclobutenes), Flare, SiLK (Dow Chemical Co., Midland, Mich.), non-porous materials, porous materials, other low-k dielectric materials, or combinations thereof. Other suitable materials are within the contemplated scope of the present disclosure.

Figure 14:
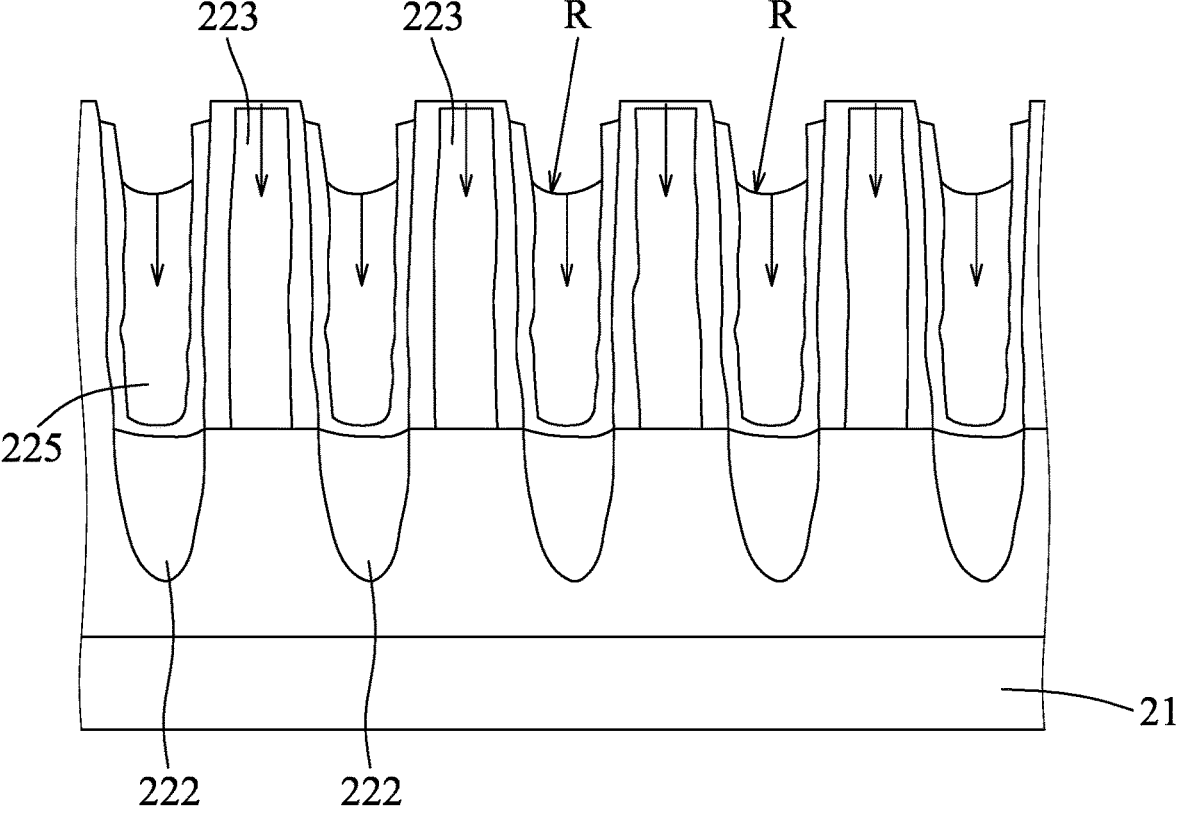
FIG. 14 is a schematic view illustrating a first ion implantation process for the gate profile modulation in the manufacturing method as depicted in FIG. 4.

In some embodiments, the ion implantation process may be conducted by ion implanting a dopant into the dummy gate structures 223 and the ILD layer 225, as shown by arrows in the example illustrated in FIG. 14. In some alternative embodiments, the ion implantation process may be conducted by ion implanting the dopant into the dummy gate structures 223 only, as shown by arrows in the example illustrated in FIG. 15. In some embodiments, the dopant used for the ion implantation process may include, for example, but not limited to, nitrogen (N), argon (Ar), silicon (Si), germanium (Ge), xenon (Xe), or combinations thereof. Other suitable species are within the contemplated scope of the present disclosure.

In some embodiments, the ion implantation process may be conducted at a temperature in a range from about −200° C. to about 500° C. If the ion implantation process is conducted at a temperature lower than −200° C. or higher than 500° C., the tool capability for conducting the ion implantation process may be negatively affected and/or the productivity issue may occur. In some embodiments, the ion implantation process may be conducted at a temperature in a range from about −100° C. to about 300° C. In some embodiments, the ion implantation process may be conducted at a temperature in a range from about −60° C. to about 150° C.

In some embodiments, the ion implantation process may be conducted at an implant energy in a range from about 1 keV to about 30 keV. If the ion implantation process is conducted at an implant energy less than 1 keV, the ion implantation process cannot be conducted efficiently such that satisfactory gate profile modulation cannot be achieved. If the ion implantation process is conducted at an implant energy greater than 30 keV, the source/drain regions 222 may be damaged. In some embodiments, the ion implantation process may be conducted at an implant energy in a range from about 1 keV to about 20 keV. In some embodiments, the ion implantation process may be conducted at an implant energy in a range from about 5 keV to about 15 keV.

In some embodiments, the ion implantation process may be conducted at an implant dose in a range from about $1\times10^{14}$ atoms/cm³ to about $1\times10^{16}$ atoms/cm³. If the ion implantation process is conducted at an implant dose less than $1\times10^{14}$ atoms/cm³ or greater than $1\times10^{16}$ atoms/cm³, water throughput and/or productivity issues may occur. In some embodiments, the ion implantation process may be conducted at an implant dose in a range from about $2\times10^{14}$ atoms/cm³ to about $5\times10^{15}$ atoms/cm³. In some embodiments, the ion implantation process may be conducted at an implant dose in a range from about $5\times10^{14}$ atoms/cm³ to about $2\times10^{15}$ atoms/cm³.

In some embodiments, the ion implantation process may be conducted at a tilt angle in a range from about 0° to about 60°. If the ion implantation process is conducted at a tile angle of greater than 60°, an undesirable shadowing effect may occur such that the ion implantation process can be conducted only at a relatively small portion of the dummy gate structures 223. In some embodiments, the ion implantation process may be conducted at a tilt angle in a range from about 0° to about 30°. In some embodiments, the ion implantation process may be conducted at a tilt angle in a range from about 0° to about 10°.

In some embodiments, the ion implantation process may be conducted at a twist angle of about 360°/2N, indicating that 2N times of the ion implantation process are conducted in a full circle of 360° of wafer/implant beam rotation. In some embodiments, N is an integer in a range from about 1 to about 4. In some embodiments, the twist angle is in a range from about 45° to about 180°, in which the smaller the twist angle, the better the implant uniformity is.

Figure 16:
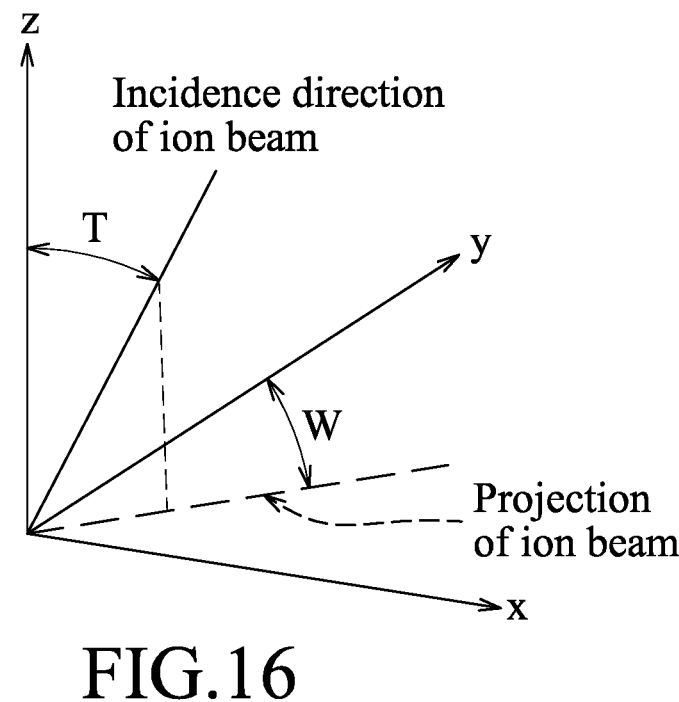
FIG. 16 is a schematic view illustrating definitions for a tilt angle (T) and a twist angle (W) of ion beam used in the ion implantation processes.

Referring to the schematic view illustrated in FIG. 16, the tile angle (T) represents an angle between an incidence direction of an ion beam and Z-axis (for example, a normal axis to a plane of a wafer), and the twist angle (W) represents an angle between a projection of the ion beam to X-Y plane (for example, the plane of the wafer) and Y-axis (for example, an extension line from a center of the wafer to a center of a notch in the wafer).

Referring to the example illustrated in FIG. 14, in some embodiments wherein the ion implantation process is conducted at a tilt angle of about 0°, the dopant used for the ion implantation process is implanted into the dummy gate structures 223 and the ILD layer 225. When the ILD layer 225 is implanted with the dopant, the recesses (R) formed on a top surface of the ILD layer 225 may have a depth in a range of greater than about 0 nm and up to about 80 nm. If the depth of the recesses (R) is greater than 80 nm, the source/drain regions 222 below the ILD layer 225 may be damaged.

Figure 15:
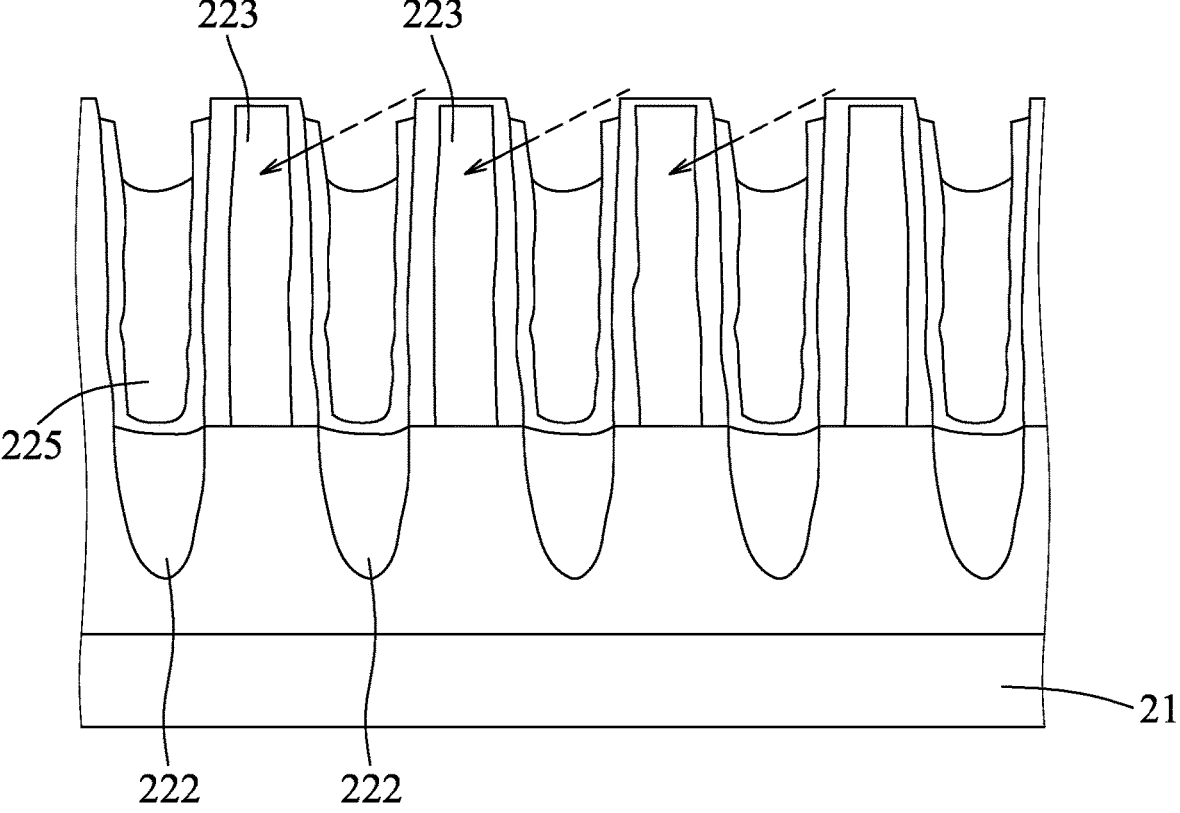
FIG. 15 is a schematic view illustrating a second ion implantation process for the gate profile modulation in the manufacturing method as depicted in FIG. 4.

Referring to the example illustrated in FIG. 15, in some embodiments, the dopant used for the ion implantation process may be implanted only into the dummy gate structures 223 by tuning the tilt angle for the ion implantation process to be greater than 0°. In some embodiments, the ion implantation process may be conducted at a tilt angle of greater than about 0° and up to about 60°. If the ion implantation process is conducted at a tile angle greater than 60°, an undesirable shadowing effect may occur such that the ion implantation process can be conducted only at a relatively small portion of the dummy gate structures 223.

Referring to FIG. 4 and the example illustrated in FIG. 5, the method 100 proceeds to step 102, where the patterned structure after the ion implantation process is subjected to an annealing process. The patterned structure 22 after the ion implantation process is subjected to an annealing process. In some embodiments, the dummy gate structure 223 and the ILD layer 225 are subjected to the annealing process. In some embodiments, the annealing process may be conducted at a temperature in a range from about 500° C. to about 1200° C. If the annealing process is conducted at a temperature greater than 1200° C., it may cause too much diffusion of the dopant in the dummy gate structures 223 and the ILD layer 225 when the ion implantation process is conducted at a tilt angle of about 0° and also in the dummy gate structures 223 when the ion implantation process is conducted at a tilt angle of greater than 0°. In some embodiments, the annealing process may be conducted at a temperature in a range from about 600° C. to about 1000° C. In some embodiments, the annealing process may be conducted at a temperature in a range from about 600° C. to about 900° C. In some embodiments, the annealing process may be, for example, but not limited to, a rapid thermal annealing (RTA) process, a laser process, a furnace annealing process, or the like. Other suitable annealing techniques are within the contemplated scope of the present disclosure. In some embodiments, the annealing process may be omitted if a desirable critical dimension of the dummy gate structures 223 is obtained after the ion implantation process. In some alternative embodiments in which a critical dimension of the dummy gate structures 223 before the gate profile modulation is in excess, the ion implantation process can be omitted such that the annealing process is directly conducted to reduce the critical dimension of the dummy gate structures 223 to a desirable dimension.

Figure 11:
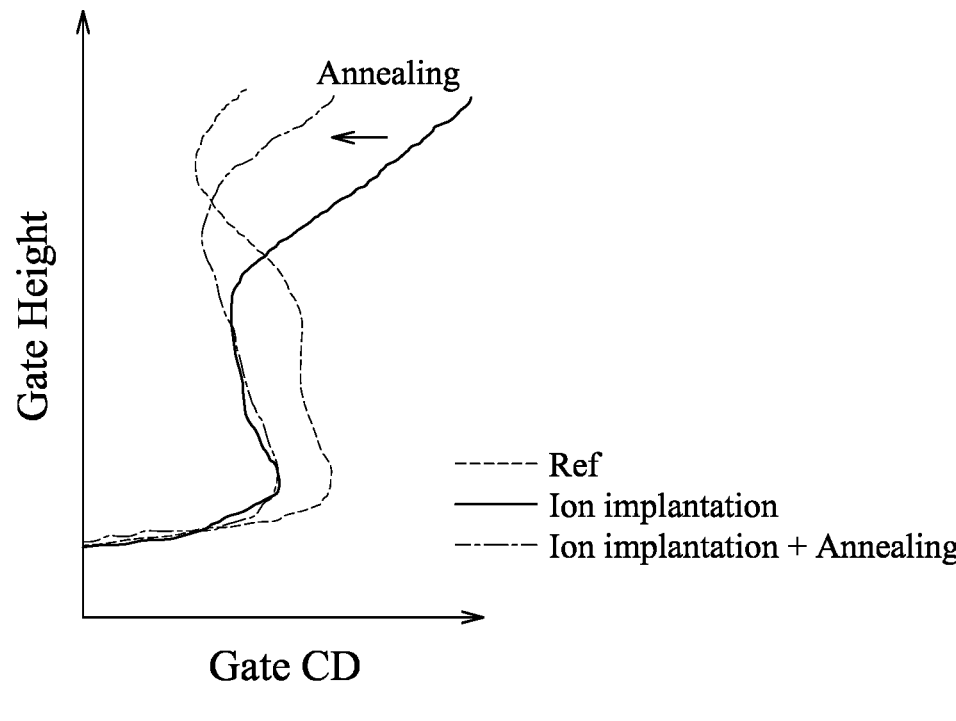
FIG. 11 is a graph showing effects of an ion implantation process and an annealing process on gate critical dimension (CD) for gate profile modulation in the manufacturing method as depicted in FIG. 4.

Referring to FIG. 11, which illustrates effects of the ion implantation process and the annealing process on the critical dimension (CD) of the dummy gate structure 223, a profile of an upper portion of the dummy gate structure 223 may be modulated by the ion implantation process and the annealing process. The critical dimension of the dummy gate structure 223 at a height in a range from about ½ H to H (wherein H is a total height of the dummy gate structures 223) is increased after the ion implantation process, compared to the critical dimension of the dummy gate structure 223 before the ion implantation process (a curve indicated by "Ref"). The critical dimension of the dummy gate structure 223 can be further modulated by the annealing process to reduce the critical dimension of the dummy gate structure 223 modulated by the ion implantation process to a desirable dimension. Therefore, an excess of a large critical dimension of the dummy gate structure 223 resulting from implant damage (for example, a thinner amorphous polysilicon region which may be produced after the ion implantation process) can be further modulated by the annealing process to recover the implant damage, so as to control the critical dimension of the upper portion of the dummy gate structure 223 to a desirable dimension.

Figure 12:
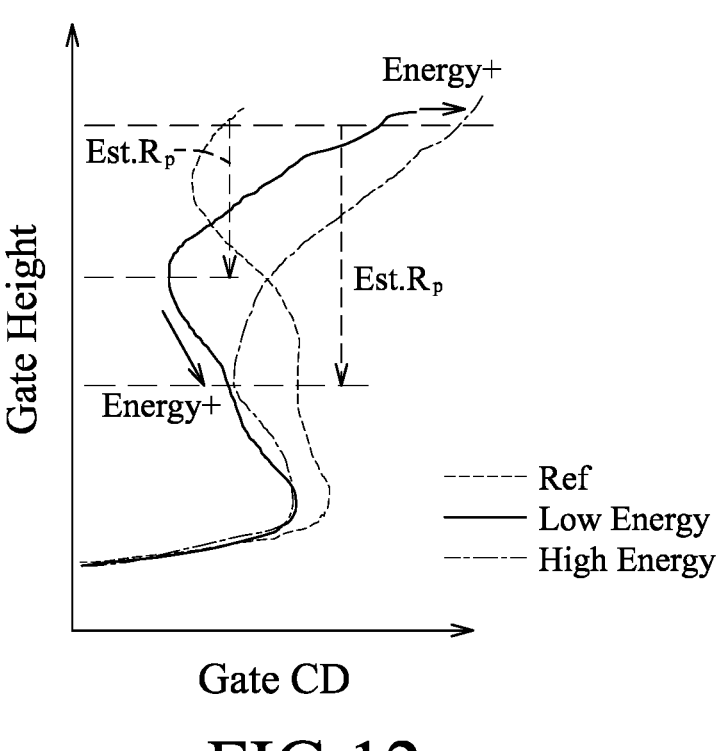
FIG. 12 is a graph showing effect of implant energy on the gate CD for the gate profile modulation in the manufacturing method as depicted in FIG. 4.

Referring to FIG. 12, which illustrates effect of the implant energy on the critical dimension of the dummy gate structure 223, the critical dimension of the dummy gate structure 223 modulated by the ion implantation process conducted at a relative high implant energy is increased significantly, compared to the critical dimension of the dummy gate structure 223 modulated by the ion implantation process conducted at a relatively low implant energy. In addition, the depth (i.e., Rp) of the peak concentration of the dopant implanted into the ILD layer 225 by the ion implantation process conducted at a relatively high implant energy is deeper than that of the peak concentration of the dopant implanted into the ILD layer 225 by the ion implantation process conducted at a relatively low implant energy. The higher implant energy (i.e., deeper Rp) would result in expansion of the ILD layer 225 at a deeper region, and the location of a minimum of the critical dimension of the dummy gate structure 223 is substantially equal to the Rp.

Figure 13:
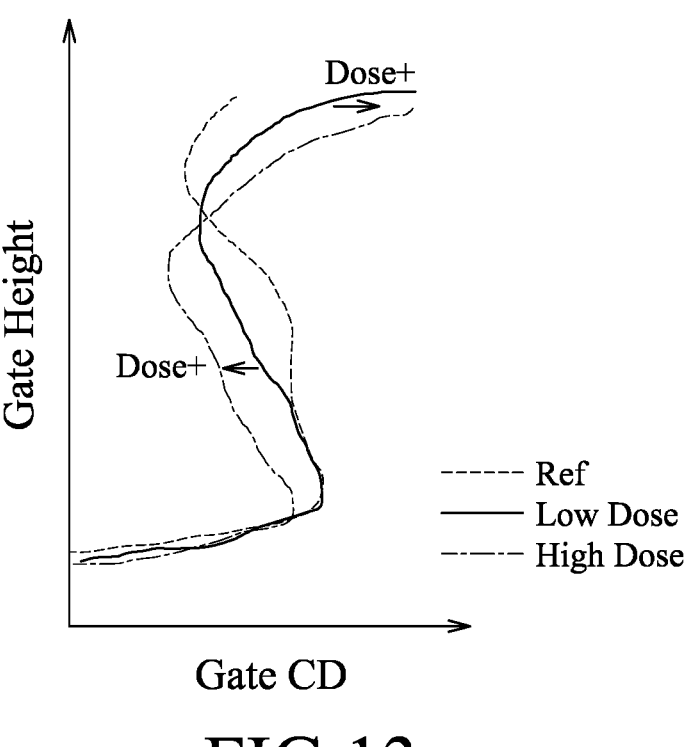
FIG. 13 is a graph showing effect of implant dose on the gate CD for the gate profile modulation in the manufacturing method as depicted in FIG. 4.

Referring to FIG. 13, which illustrates effect of the implant dose on the critical dimension of the dummy gate structure 223, at an upper portion of the dummy gate structure 223 (for example, at a height of the dummy gate structure 223 in a range from about ½ H to H, wherein H is a total height of the dummy gate structures 223), the critical dimension of the dummy gate structure 223 modulated by the ion implantation process conducted at a relatively high implant dose is increased significantly due to increased expansion of the ILD layer 225, compared to the critical dimension of the dummy gate structure 223 modulated by the ion implantation process conducted at a relatively low implant dose.

Figure 6:
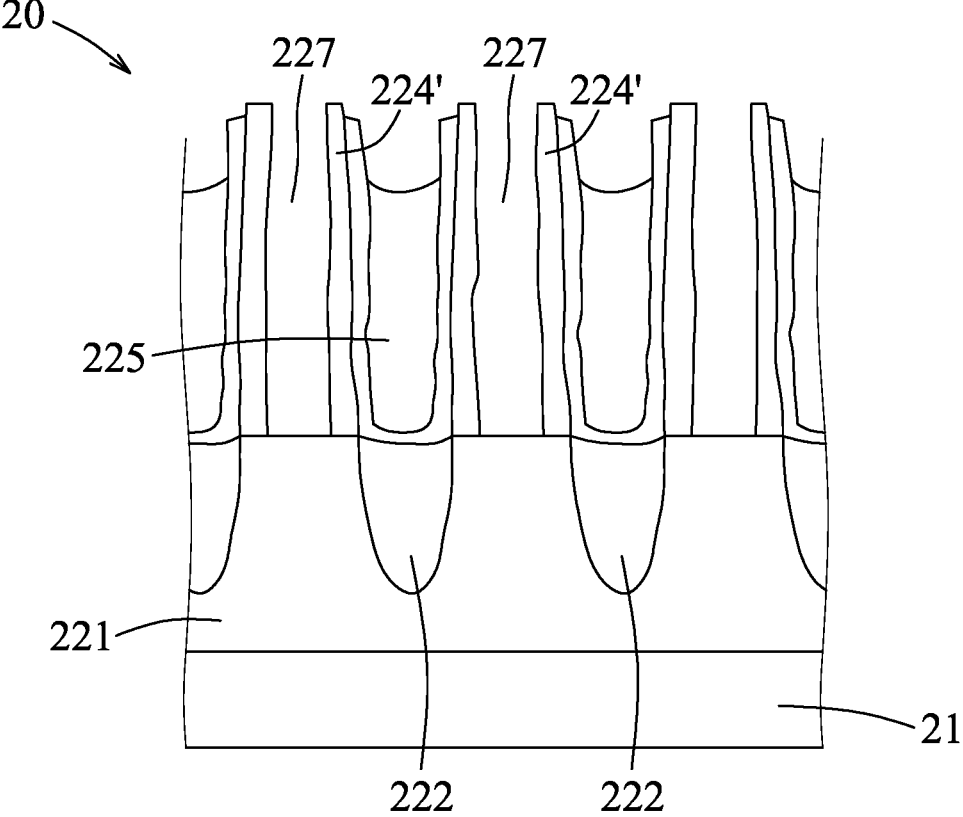

Referring to FIG. 4 and the example illustrated in FIG. 6, the method 100 proceeds to step 103, where the dummy gate structures are removed to form recesses in the patterned structure. The dummy gate structures 223 are removed to form recesses 227, each of which is disposed between corresponding two of spacers 224'. The spacers 224' may be formed by removing top portions of the spacer layers 224 by a planarization technique, for example, but not limited to, chemical mechanical planarization (CMP) conducted prior to the removal of the dummy gate structures 223. The removal of the dummy gate structures 223 may be conducted by, for example, but not limited to, a selective etching process, which may include, for example, but not limited to, a selective dry etching process, a selective wet etching process, or a combination thereof. Other suitable removing techniques are within the contemplated scope of the present disclosure. Since the profile of the dummy gate structures 223 is modulated by the ion implantation process, the annealing process, or a combination thereof, the recesses 227 formed after the removal of the dummy gate structures 223 will not have a bowing profile.

Figure 7:
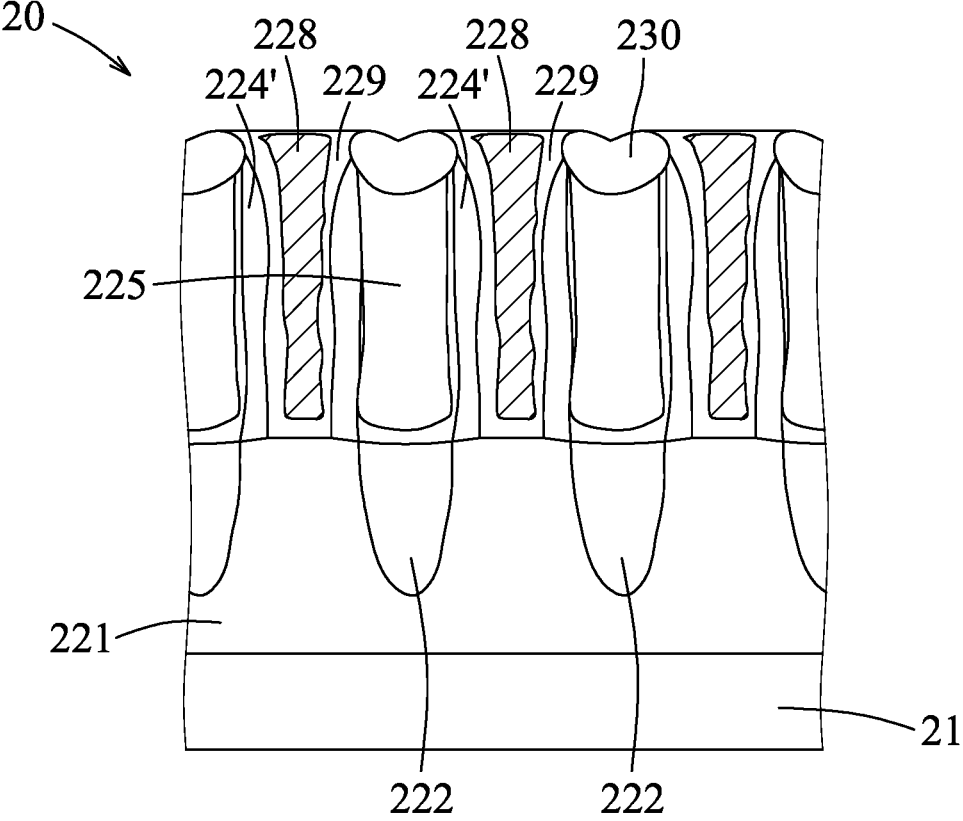

Referring to FIG. 4 and the examples illustrated in FIGS. 6 and 7, the method 100 proceeds to step 104, where a plurality of gate dielectrics and a plurality of metal gates are formed in the recesses. A gate dielectric layer and a metal filling layer are sequentially formed over a top surface of the ILD layer 225 to fill the recesses 227 through a deposition process, which may include, for example, but not limited to, chemical vapor deposition (CVD), plasma enhanced CVD (PECVD), atomic layer deposition (ALD), plasma enhanced ALD (PEALD), molecular layer deposition (MLD), physical vapor deposition (PVD), sputtering, or combinations thereof. Other suitable deposition techniques are within the contemplated scope of the present disclosure. The gate dielectric layer may include, from inner to outer, an interlayer dielectric, which may include, for example, but not limited to, silicon oxide, silicon nitride, silicon oxynitride, other suitable materials, or combinations thereof, and a layer of high dielectric constant (k) material or other suitable materials. The metal filling layer may include, from inner to outer, a barrier layer, a work function layer, and a filling material layer. The barrier layer may prevent diffusion of a metal into the gate dielectric layer. The work function layer may include, for example, but not limited to, titanium, aluminum, tantalum carbide, tantalum carbide nitride, tantalum silicon nitride, or combinations thereof. Other suitable materials are within the contemplated scope of the present disclosure. The filling material layer may include, for example, but not limited to, aluminum, tungsten, copper, or combinations thereof. Other suitable materials are within the contemplated scope of the present disclosure. A planarization process (for example, but not limited to, CMP) is conducted to remove portions of the gate dielectric layer and the metal filling layer over the top surface of the ILD layer 225 so as to form a plurality of metal gates 228 respectively disposed in the recesses 227 and a plurality of gate dielectrics 229 respectively disposed in the recesses 227 to separate the metal gates 228 from the spacers 224'. Thereafter, a patterned mask layer 230 (for example, a patterned hard mask layer) is formed on ILD layer 225 to expose the metal gates 228 and the gate dielectrics 229 from openings of the patterned mask layer 230. Examples of a material suitable for forming the patterned mask layer 230 may include, for example, but not limited to, silicon nitride, silicon carbide, silicon oxycarbide, silicon oxynitride, silicon carbonitride, silicon oxycarbonitride, tungsten nitride, tungsten carbide, titanium nitride, zirconium oxide, aluminum oxide, yttrium oxide, aluminum oxynitride, hafnium oxide, hafnium zirconium oxide, hafnium silicon oxide, hafnium silicon oxynitride, zirconium silicon oxide, hafnium zirconium silicon oxide, hafnium aluminum oxide, hafnium aluminum nitride, zirconium aluminum oxide, ytterbium oxide, and combinations thereof. Other suitable materials are within the contemplated scope of the present disclosure. As described above, the recesses 227 formed after the removal of the dummy gate structures 223 will not have a bowing profile, and thus, voids or seams will not be formed in the metal gates 228.

Figure 8:
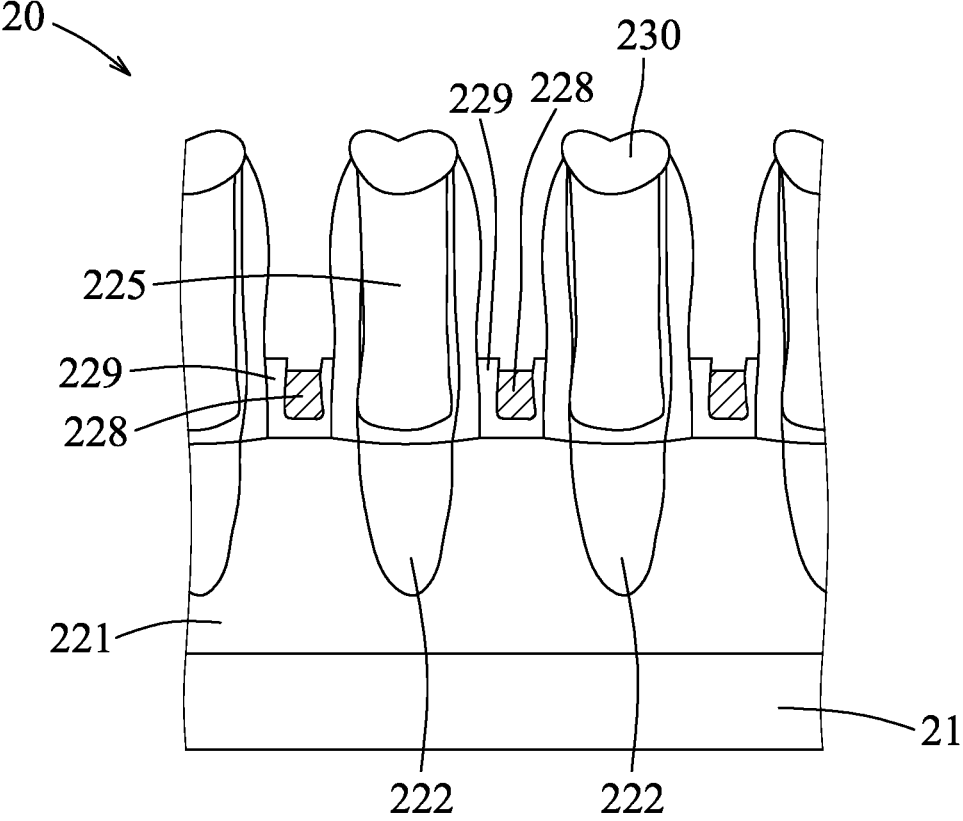

Referring to FIG. 4 and the example illustrated in FIG. 8, the method 100 proceeds to step 105, where the metal gates and the gate dielectrics are subjected to an etching back process. The metal gates 228 and the gate dielectrics 229 are subjected to an etching back process to reduce the heights thereof. The etching back process may be conducted through the openings of the patterned mask layer 230 by a dry etching process, a wet etching process, or a combination thereof, so as to remove top portions of the metal gates 228 and the gate dielectrics 229. As described above, since the voids or the seams will not be formed in the metal gates 228, the metal gates 228 will not be detached from the gate dielectrics 229 during the etching back process.

Figure 9:
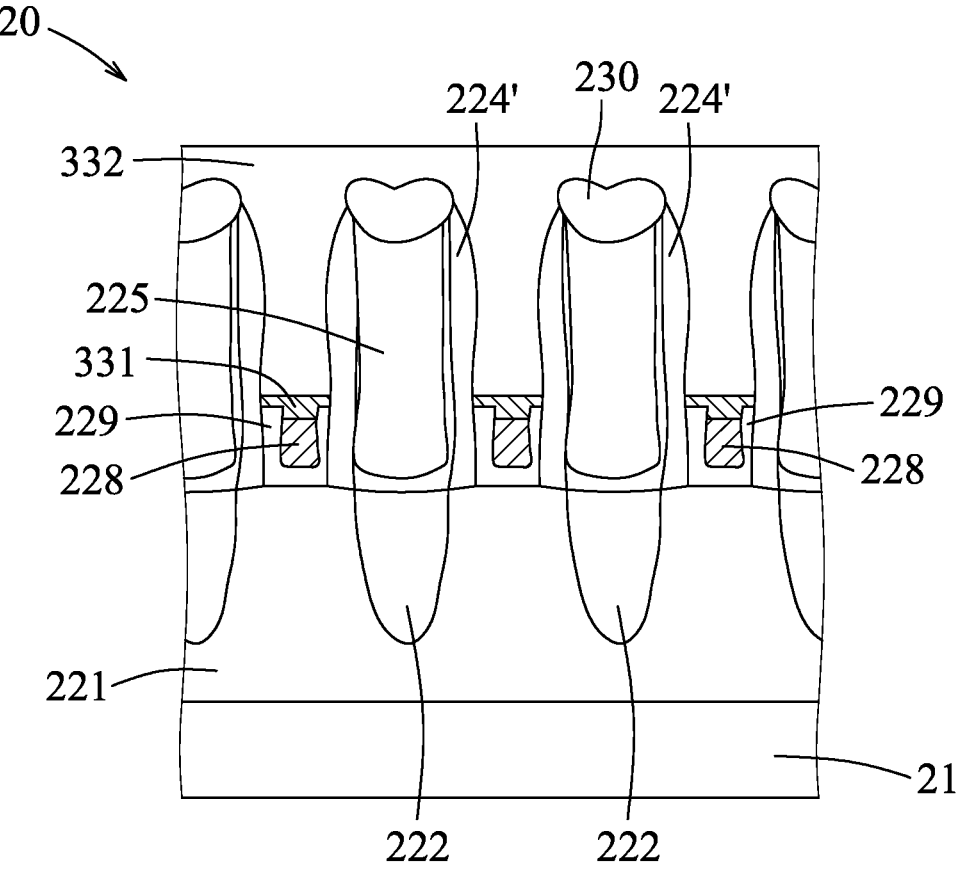

Referring to FIG. 4 and the example illustrated in FIG. 9, the method 100 proceeds to step 106, where a conductive capping layer is formed on the metal gates and the gate dielectrics. A conductive capping layer 331 is formed on the metal gates 228 and the gate dielectrics 229 by, for example, but not limited to, a selective deposition process. In some embodiments, the selective deposition process may include, for example, but not limited to, a selective CVD process, a selective ALD process, a selective PECVD, or a selective PEALD. Other suitable techniques are within the contemplated scope of the present disclosure. The conductive capping layer 331 may include any suitable conductive material. In some embodiments, the conductive capping layer 331 may include a metal (for example, but not limited to, tungsten (W), cobalt (Co), or other suitable metals) or a metal alloy (for example, but not limited to, cobalt tungsten (CoW) or other suitable metal alloys). Other suitable conductive materials are within the contemplated scope of the present disclosure.

Referring to FIG. 4 and the example illustrated in FIG. 9, the method 100 proceeds to step 107, where a self-aligned contact layer is formed on the conductive capping layer. A self-aligned contact (SAC) layer 332 is formed on the conductive capping layer 331 by a suitable deposition process to cover the spacers 224' and the patterned mask layer 230. In some embodiments, the deposition process may include, for example, but not limited to, CVD, PECVD, ALD, PEALD, or PVD. Other suitable techniques are within the contemplated scope of the present disclosure. In some embodiments, the SAC layer 332 may include silicon nitride, silicon nitride doped with carbon, silicon oxide, silicon oxynitride, silicon oxynitride doped with carbon, amorphous carbon material, silicon carbide, other nitride materials, other carbide materials, aluminum oxide, other oxide materials, other metal oxides, boron nitride, boron carbide, other low-k dielectric materials, or low-k dielectric materials doped with one or more of carbon, nitrogen, and hydrogen. Other suitable materials are within the contemplated scope of the present disclosure. Composition of the SAC layer 332 may be selected based on etching selectivity to one or more additional features of the patterned structure 22.

Figure 10:
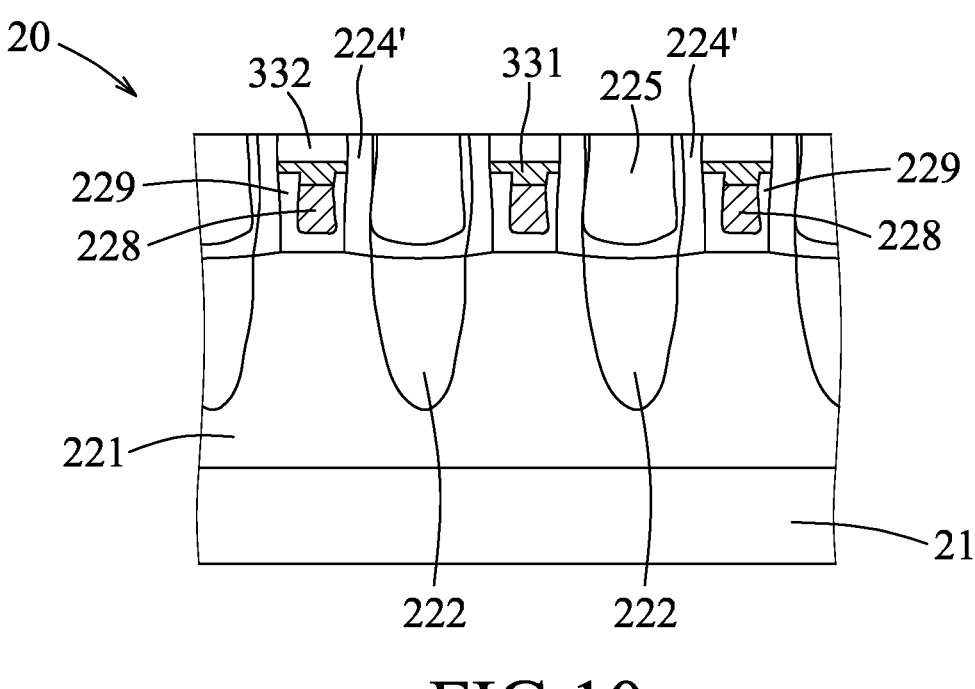

Referring to FIG. 4 and the examples illustrated in FIGS. 9 and 10, the method 100 proceeds to step 108, where a planarization process is conducted. A planarization process (for example, but not limited to, CMP) is conducted to remove the patterned mask layer 230, portions of the spacers 224', and a portion of the ILD layer 225.

Figure 17:
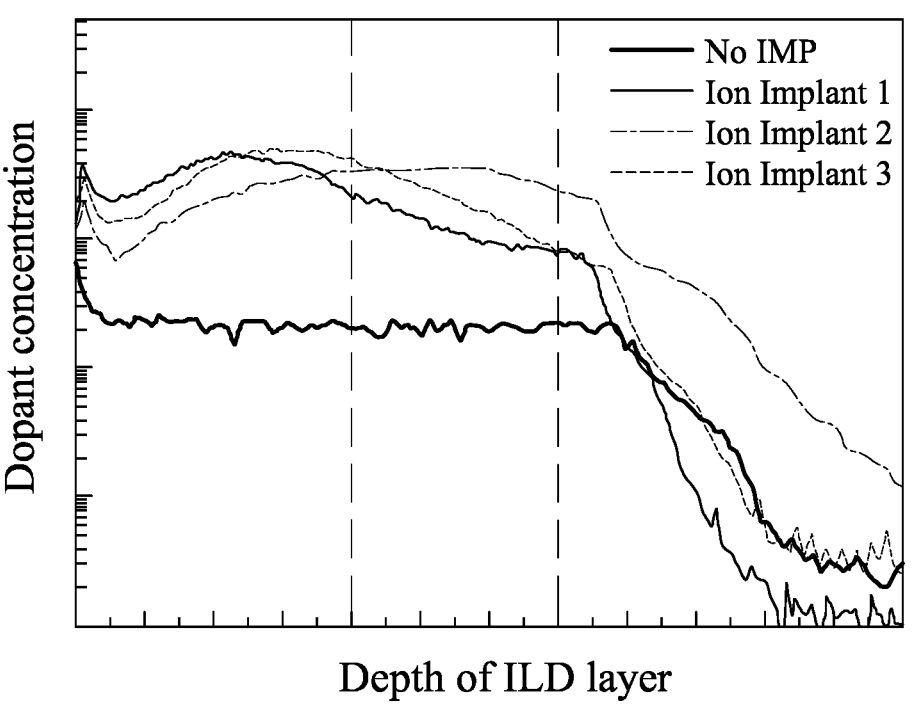
FIG. 17 is a graph showing relationships between dopant concentration in a silicon oxide layer (an interlayer dielectric layer) and depth of the silicon oxide layer.

Referring to FIG. 17 and the example illustrated in FIG. 10, after the gate profile modulation conducted by the ion implantation process and optionally the annealing process, the dopant concentration in an upper portion of the ILD layer 225 (i.e., in a relatively small depth portion of the ILD layer 225) is greater than that in a lower portion of the ILD layer 225 (i.e., in a relatively large depth portion of the ILD layer 225). In some embodiments, the dopant concentration in the relatively small depth portion of the ILD layer 225 is in a range from about $1\times10^{20}$ atoms/cm$^3$ to about $1\times10^{21}$ atoms/cm$^3$. In some embodiments, the dopant concentration in the relatively small depth portion of the ILD layer 225 is in a range from about $1\times10^{20}$ atoms/cm$^3$ to about $5\times10^{20}$ atoms/cm$^3$. In some embodiments, the portion of the ILD layer 225 having the dopant concentration in the range described above is at a depth ranging from about 40 nm to about 70 nm, which corresponds to a height of the metal gate 228 in a range from about 5 nm to about 30 nm.

In the present disclosure, the material properties (for example, expansion, stress effect, or the like) of the dummy gate structures (for example, the poly gates), the ILD layer, and the spacers can by modified by the ion implantation process, the annealing process, or a combination thereof, such that the profile (for example, the critical dimension) of the dummy gate structures and the dimension of via contacts to be formed can be modulated accordingly. The profile of the dummy gate structures can be customized by adjusting the operation conditions for the ion implantation process and the annealing process and the depth of the recesses formed on a top surface of the ILD layer, so as to improve a process window of a metal gate gap-filling process. The profile modulation of the dummy gate structures through the ion implantation process, the annealing process, or a combination thereof can be applied in the formation of N-type field effect transistors (NFETs) and P-type field effect transistors (PFETs) of a planar structure, a FinFET structure, and a nanosheet structure in a complementary metal oxide semiconductor (CMOS) process.

In accordance with some embodiments of the present disclosure, a method for manufacturing a semiconductor device includes: forming a patterned structure on a substrate, in which the patterned structure includes a dielectric layer and a dummy gate structure disposed in the dielectric layer; and subjecting the dummy gate structure to an ion implantation process so as to modulate a profile of the dummy gate structure.

In accordance with some embodiments of the present disclosure, the ion implantation process is conducted by ion implanting a dopant into the dummy gate structure, and the dopant includes nitrogen, argon, silicon, germanium, xenon, or combinations thereof.

In accordance with some embodiments of the present disclosure, the ion implantation process is conducted at a temperature in a range from about −200° C. to about 500° C.

In accordance with some embodiments of the present disclosure, the ion implantation process is conducted at an implant energy in a range from about 1 keV to about 30 keV.

In accordance with some embodiments of the present disclosure, the ion implantation process is conducted at an implant dose in a range from about $1\times10^{14}$ atoms/cm$^3$ to about $1\times10^{16}$ atoms/cm$^3$.

In accordance with some embodiments of the present disclosure, the ion implantation process is conducted at a tilt angle in a range from about 0° to about 60°.

In accordance with some embodiments of the present disclosure, the ion implantation process is conducted at a twist angle in a range from about 45° to about 180°.

In accordance with some embodiments of the present disclosure, a top surface of the dielectric layer is formed with a recess having a depth in a range of greater than about 0 nm and up to about 80 nm.

In accordance with some embodiments of the present disclosure, a method for manufacturing a semiconductor device includes: forming a patterned structure on a substrate, in which the patterned structure includes a dielectric layer and a dummy gate structure disposed in the dielectric layer; and subjecting the dummy gate structure to an annealing process so as to modulate the profile of the dummy gate structure.

In accordance with some embodiments of the present disclosure, the method further includes: subjecting the dummy gate structure to an ion implantation process so as to modulate a profile of the dummy gate structure.

In accordance with some embodiments of the present disclosure, the annealing process is conducted at a temperature in a range from 500° C. to 1200° C.

In accordance with some embodiments of the present disclosure, the ion implantation process is conducted by ion implanting a dopant into the dummy gate structure, and the dopant includes nitrogen, argon, silicon, germanium, xenon, or combinations thereof.

In accordance with some embodiments of the present disclosure, the ion implantation process is conducted at a temperature in a range from about −200° C. to about 500° C.

In accordance with some embodiments of the present disclosure, the ion implantation process is conducted at an implant energy in a range from about 1 keV to about 30 keV.

In accordance with some embodiments of the present disclosure, the ion implantation process is conducted at an implant dose in a range from about $1\times10^{14}$ atoms/cm$^3$ to about $1\times10^{16}$ atoms/cm$^3$.

In accordance with some embodiments of the present disclosure, the ion implantation process is conducted at a tilt angle in a range from about 0° to about 60°.

In accordance with some embodiments of the present disclosure, a top surface of the dielectric layer is formed with a recess having a depth in a range of greater than about 0 nm and up to about 80 nm.

In accordance with some embodiments of the present disclosure, a semiconductor device includes a substrate, a semiconductor fin disposed on the substrate, a dielectric layer disposed on the semiconductor fin and including a dopant, and a metal gate disposed in the dielectric layer. A dopant concentration in an upper portion of the dielectric layer is in a range from $1\times10^{20}$ atoms/cm$^3$ to $1\times10^{21}$ atoms/cm$^3$.

In accordance with some embodiments of the present disclosure, the portion of the dielectric layer having the dopant concentration in the range from $1\times10^{20}$ atoms/cm$^3$ to $1\times10^{21}$ atoms/cm$^3$ is at a depth ranging from 40 nm to 70 nm.

In accordance with some embodiments of the present disclosure, the depth of the dielectric layer ranging from 40 nm to 70 nm corresponds to a height of the metal gate in a range from 5 nm to 30 nm.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:

forming a patterned structure on a substrate, the patterned structure including a dielectric layer and a dummy gate structure disposed in the dielectric layer;

increasing a dimension of the dummy gate structure by subjecting the dummy gate structure to an ion implantation process so as to modulate the dimension of the dummy gate structure to a desirable dimension;

after the dimension of the dummy gate structure is modulated to the desirable dimension, removing the dummy gate structure to form a recess;

forming a metal gate and a gate dielectric in the recess, wherein the metal gate is disposed on the gate dielectric; and forming a conductive capping layer in the recess, wherein the conductive capping layer is formed with an upper portion disposed on a top surface of the gate dielectric, and a lower portion extending from the upper portion and in contact with the metal gate, wherein the patterned structure further includes a spacer layer which includes two lateral portions covering two opposite lateral surfaces of the dummy gate structure, and a top portion covering a top surface of the dummy gate structure, the two lateral portions and the top portion of the spacer layer are formed integrally at the same time; and the method further comprises, after the ion implantation process: removing the top portion of the spacer layer to form a pair of spacers, so that the recess is formed between the pair of spacers.

2. The method according to claim 1, wherein the ion implantation process is conducted by ion implanting a dopant into the dummy gate structure and the dielectric layer, and a depth of a peak concentration of the dopant implanted into the dielectric layer is increased by increasing an implant energy at which the ion implantation process is conducted.

3. The method according to claim 2, wherein after the ion implantation process, a minimum of the dimension of the dummy gate structure is located at a level equal to the depth of the peak concentration of the dopant implanted into the dielectric layer.

4. The method according to claim 1, wherein the ion implantation process is conducted at a temperature in a range from −200° C. to 500° C.

5. The method according to claim 1, wherein the ion implantation process is conducted at an implant energy in a range from 1 keV to 30 keV.

6. The method according to claim 1, wherein the ion implantation process is conducted at an implant dose in a range from $1\times10^{14}$ atoms/cm$^3$ to $1\times10^{16}$ atoms/cm$^3$.

7. The method according to claim 1, wherein the ion implantation process is conducted at a tilt angle in a range from 0° to 60°.

8. The method according to claim 1, wherein the ion implantation process is conducted at a twist angle in a range from 45° to 180°.

9. The method according to claim 1, wherein a top surface of the dielectric layer is formed with a recess having a depth in a range of greater than 0 nm and up to 80 nm.

10. The method according to claim 1, wherein the dimension of the dummy gate structure at a height in a range from ½ H to His increased after the ion implantation process, wherein H is a total height of the dummy gate structures.

11. The method according to claim 1, wherein the ion implantation process is conducted by ion implanting a dopant into the dummy gate structure, and the dopant includes nitrogen, argon, silicon, germanium, xenon, or combinations thereof.

12. The method according to claim 1, further comprising: forming a self-aligned contact layer on the conductive capping layer opposite to the metal gate, wherein the self-aligned contact layer has a width greater than a width of the lower portion of the conductive capping layer.

13. A method for manufacturing a semiconductor device, comprising:

forming a patterned structure on a substrate, the patterned structure including a dielectric layer, a dummy gate structure disposed in the dielectric layer, and a spacer layer which includes two lateral portions covering two opposite lateral surfaces of the dummy gate structure, and a top portion covering a top surface of the dummy gate structure, wherein the two lateral portions and the top portion of the spacer layer are formed integrally at the same time;

reducing a dimension of the dummy gate structure by subjecting the dummy gate structure to an annealing process so as to modulate the dimension of the dummy gate structure to a desirable dimension;

after the dimension of the dummy gate structure is modulated to the desirable dimension, removing the top portion of the spacer layer to form a pair of spacers; and removing the dummy gate structure to form a recess between the pair of spacers.

14. The method according to claim 13, wherein the annealing process is conducted at a temperature in a range from 500° C. to 1200° C.

15. A method for manufacturing a semiconductor device, comprising:

forming a patterned structure on a substrate, the patterned structure including a dielectric layer, a dummy gate structure disposed in the dielectric layer, and a spacer layer which includes two lateral portions covering two opposite lateral surfaces of the dummy gate structure, and a top portion covering a top surface of the dummy gate structure, wherein the two lateral portions and the top portion of the spacer layer are formed integrally at the same time;

increasing a dimension of the dummy gate structure to an excess dimension by subjecting the dummy gate structure to an ion implantation process;

reducing the excess dimension of the dummy gate structure by subjecting the dummy gate structure to an annealing process so as to modulate the excess dimension of the dummy gate structure to a desirable dimension;

after the dimension of the dummy gate structure is modulated to the desirable dimension, removing the top portion of the spacer layer to form a pair of spacers; and removing the dummy gate structure to form a recess between the pair of spacers.

16. The method according to claim 15, wherein the ion implantation process is conducted by ion implanting a dopant into the dummy gate structure, and the dopant includes nitrogen, argon, silicon, germanium, xenon, or combinations thereof.

17. The method according to claim 16, wherein the dielectric layer is implanted by the dopant in the ion implantation process.

18. The method according to claim 16, wherein the ion implantation process is conducted at a tilt angle of greater than 0° and up to 60°.

19. The method according to claim 17, wherein the ion implantation process is conducted at a tilt angle in a range from 0° to 60°.

20. The method according to claim 15, wherein the annealing process includes a rapid thermal annealing process, a laser process, or a furnace annealing process.

* * * * *